United States Patent
Huang et al.

(10) Patent No.: US 8,890,552 B2
(45) Date of Patent: Nov. 18, 2014

(54) SENSING CIRCUIT AND METHOD FOR A FLYBACK CONVERTER

(75) Inventors: Pei-Lun Huang, Zhubei (TW); Kuang-Ming Chang, Zhongli (TW)

(73) Assignee: Richtek Technology Corp., Hsinchu (TW)

( * ) Notice: Subject to any disclaimer, the term of this patent is extended or adjusted under 35 U.S.C. 154(b) by 478 days.

(21) Appl. No.: 12/457,128

(22) Filed: Jun. 2, 2009

(65) Prior Publication Data

US 2009/0302827 A1   Dec. 10, 2009

(30) Foreign Application Priority Data

Jun. 6, 2008   (TW) ................... 97121165 A

(51) Int. Cl.
*G01R 27/08* (2006.01)
*H02M 3/335* (2006.01)
*G01R 19/00* (2006.01)
*H02M 1/00* (2006.01)

(52) U.S. Cl.
CPC ....... *H02M 3/33507* (2013.01); *G01R 19/0092* (2013.01); *H02M 2001/0009* (2013.01)
USPC ........ 324/713; 324/76.74; 324/679; 324/715; 340/438; 280/735

(58) Field of Classification Search
USPC .............. 324/713, 76.74, 679, 715; 280/735; 340/438
See application file for complete search history.

(56) References Cited

U.S. PATENT DOCUMENTS

| | | | |
|---|---|---|---|
| 4,200,833 A * | 4/1980 | Wilkerson ................... 323/283 |
| 4,273,954 A * | 6/1981 | Takeuchi et al. ........... 178/18.07 |
| 5,382,912 A * | 1/1995 | Blain ........................... 324/713 |
| 6,405,047 B1 * | 6/2002 | Moon ......................... 455/456.1 |
| 6,594,795 B1 * | 7/2003 | Satou .......................... 714/795 |
| 6,674,656 B1 * | 1/2004 | Yang et al. ................. 363/21.1 |
| 7,196,503 B2 * | 3/2007 | Wood et al. ................. 323/276 |
| 7,697,308 B2 * | 4/2010 | Huynh et al. .............. 363/21.16 |
| 7,919,970 B2 * | 4/2011 | Hazani et al. ................ 324/691 |
| 8,058,882 B2 * | 11/2011 | Hernandez-Marti et al. . 324/538 |
| 2003/0040856 A1 * | 2/2003 | Winner et al. ................ 701/34 |

* cited by examiner

*Primary Examiner* — Huy Q Phan
*Assistant Examiner* — Temilade S Rhodes-Vivour
(74) *Attorney, Agent, or Firm* — Muncy, Geissler, Olds & Lowe, P.C.

(57) ABSTRACT

A flyback converter includes a transformer to convert an input voltage into an output voltage, a control circuit senses a primary current of the transformer to generate a current sense signal, and a sensing circuit is configured to sense a variation of the current sense signal between two time points for extracting the input voltage information therefrom.

6 Claims, 7 Drawing Sheets

SENSING CIRCUIT AND METHOD FOR A FLYBACK CONVERTER

FIELD OF THE INVENTION

The present invention is related generally to a flyback converter and, more particularly, to a sensing circuit and method for a flyback converter.

BACKGROUND OF THE INVENTION

As shown in FIG. 1, a conventional flyback converter 10 includes a controller chip 12 to provide a control signal VGATE to switch a power switch SW serially connected to a transformer 14, so as to convert an input voltage VIN into an output voltage VOUT for a load RL, an opto-coupler 16 to generate a feedback signal Vcomp according to the output voltage VOUT for the controller chip 12, and a current sense resistor Rcs serially connected to the power switch SW to provide a current sense signal Vcs, which is a function of the primary current Ip of the transformer 14, for the controller chip 12. The controller chip 12 determines the control signal VGATE according to the feedback signal Vcomp and the current sense signal Vcs. For the flyback converter 10, the input voltage information at the power input VIN is very important because it is useful in controlling the maximum output power of the flyback converter 10. In addition, the input voltage VIN also has great impact on the load point at which the flyback converter 10 enters frequency reduction mode or burst mode control.

FIG. 2 is a diagram showing the burst mode entry points under different input voltages VIN. When the load RL transits to light, the load current IL supplying for the load RL begins to fall down, as shown by the waveform 20, and in consequence the feedback signal Vcomp decreases accordingly. The flyback converter 10 will enter a burst mode when the feedback signal Vcomp becomes lower than a preset level 26. Actually, due to the propagation delay and slope compensation, the variation of the input voltage VIN will change the time point at which the flyback converter 10 enters the burst mode. More particularly, when the input voltage VIN is higher, the feedback signal Vcomp will have a lower level, as shown by the waveform 24, so that the flyback converter 10 enters the burst mode earlier, which may lead to audio noise. On the contrary, when the input voltage VIN is lower, the feedback signal Vcomp will have a higher level, as shown by the waveform 22, and consequently, the flyback converter 10 enters the burst mode later and may have poor efficiency. It is therefore needed compensation by the input voltage information.

On the other hand, minimum on-time control is useful to reduce the switching frequency of the power switch SW under no load or light load. However, for a fixed minimum on-time, the output ripple becomes large under light load at high input voltage. During low input voltage, energy transfer of each switching is so small and cannot reduce the switching frequency much. This can be solved by modulating the minimum on-time by the input voltage information.

There are two common methods to obtain the input voltage information, as shown in FIGS. 3 and 4. As shown in FIG. 3, the first one is to insert serially connected resistors R1 and R2 between the power input VIN and the controller chip, to produce a current I1 containing the input voltage information, while the other one, as shown in FIG. 4, uses voltage divider resistors R1, R2 and R3 at the power input VIN to obtain the input voltage information. However, both of them need extra pin Vinsense and external components for sensing the input voltage VIN. If the controller chip 12 shown in FIG. 1 has six-pin package, all the six pins thereof have be used so that no blank pins are available for sensing the input voltage VIN. Eight-pin package may be used instead, but it costs more than that of six-pin package. Moreover, for some SOP-8 applications, there is a pin left for high voltage startup device and an adjacent pin thereof is cut to leave enough safety distance. The other six pins are the same assignment as the six-pin package, so there is no extra pin for sensing the input voltage VIN neither.

Therefore, it is desired a solution to obtain the input voltage information without extra pins.

SUMMARY OF THE INVENTION

An object of the present invention is to provide a sensing circuit and method for a flyback converter to obtain the input voltage information without extra pins.

According to the present invention, the current sense signal of a flyback converter is sampled and held twice at two time points which have a time difference therebetween, the difference between the sensed values is obtained by a subtraction circuit. Preferably, the time difference between the two time points is set according to the propagation delay. The variation of the current sense signal from the first time point to the second time point may be used to provide the input voltage information, since the primary current of the transformer of the flyback converter is related to the input voltage. In this scheme, there will be no extra pins needed since the flyback converter has a pin for sensing the primary current of the transformer.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 5:
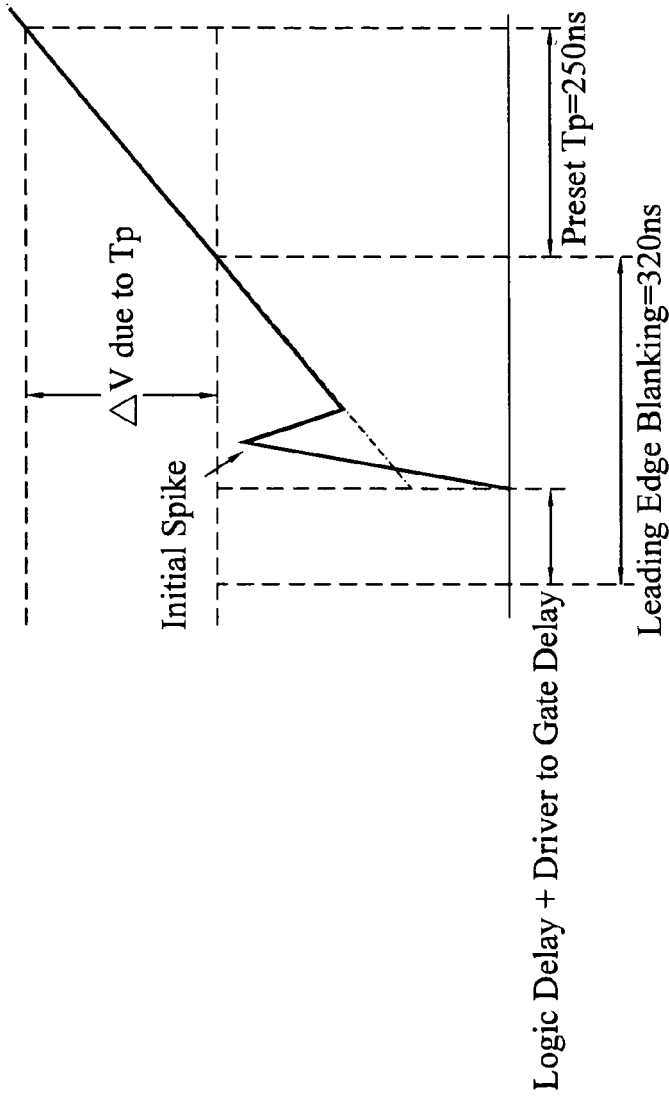
FIG. 5 is waveform diagram of a current sense signal in the flyback converter shown in FIG. 1.

Without extra pins to detect the input voltage VIN, the input voltage information of a flyback converter can be extracted from two signals, one is the duty of the power switch SW and the other is the current sense signal Vcs. However, the duty of the power switch SW is not a good choice because it varies significantly in a continuous conduction mode (CCM), a discontinuous conduction mode (DCM) and a transient response. For the current sense signal Vcs, as shown in FIG. 5, during a time period Tp it will have a variation $$\Delta V = (VIN \times Tp \times Rcs)/Lm, \qquad [\text{Eq-1}]$$

where Rcs is the resistance of the current sense resistor, and Lm is the magnetizing inductance of the primary side of the transformer 14. Therefore, if the variation ΔV of the current sense signal Vcs during the time period Tp is determined, then the input voltage information can be derived therefrom according to the equation Eq-1. Furthermore, in designs for different output powers, the resistance Rcs and the magnetizing inductance Lm both increase and decrease in the same direction. In other words, the variation ΔV of the current sense signal Vcs is hardly affected by the variation of output power. This makes circuit design easier. Under DCM control, such as low power or primary feedback application, the output power can be stabilized by subtracting the variation ΔV of the current sense signal Vcs from a current limit threshold which is a function of the feedback signal Vcomp, and when the current sense signal Vcs reaches the current limit threshold, the controller chip 12 will turn off the power switch SW.

Figure 6:
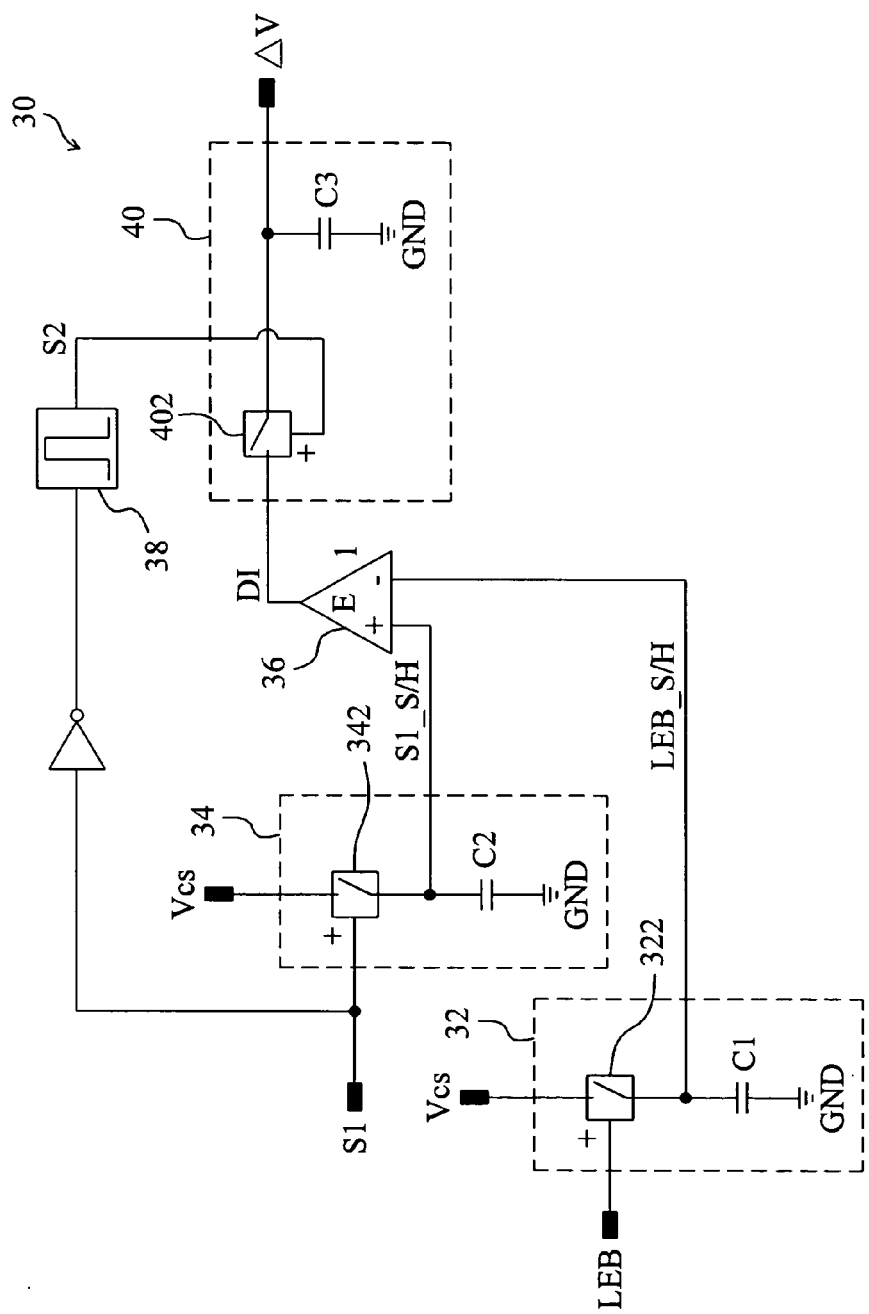
FIG. 6 is a circuit diagram of an embodiment according to the present invention.

An embodiment according to the present invention is shown in FIG. 6. A sensing circuit 30 includes a sampling and holding circuit 32 to sample and hold the current sense signal Vcs under control of a leading-edge blanking signal LEB to generate a signal LEB_S/H. The leading-edge blanking signal LEB is one that is used in a conventional flyback converter 10 to blank the Vcs sensing with a time period. Another sampling and holding circuit 34 samples and holds the current sense signal Vcs under control of a signal S1 to generate a signal S1_RS/H. In this embodiment, an error amplifier 36 serves as a subtraction circuit to obtain the difference DI between the signals LEB_S/H and S1_S/H. A one-shot circuit 38 generates a signal S2 in response to the inverted one of the signal S1, and a sampling and holding circuit 40 samples and holds the signal DI under control of the signal S2 as to obtain the variation ΔV of the current sense signal Vcs.

Figure 1:
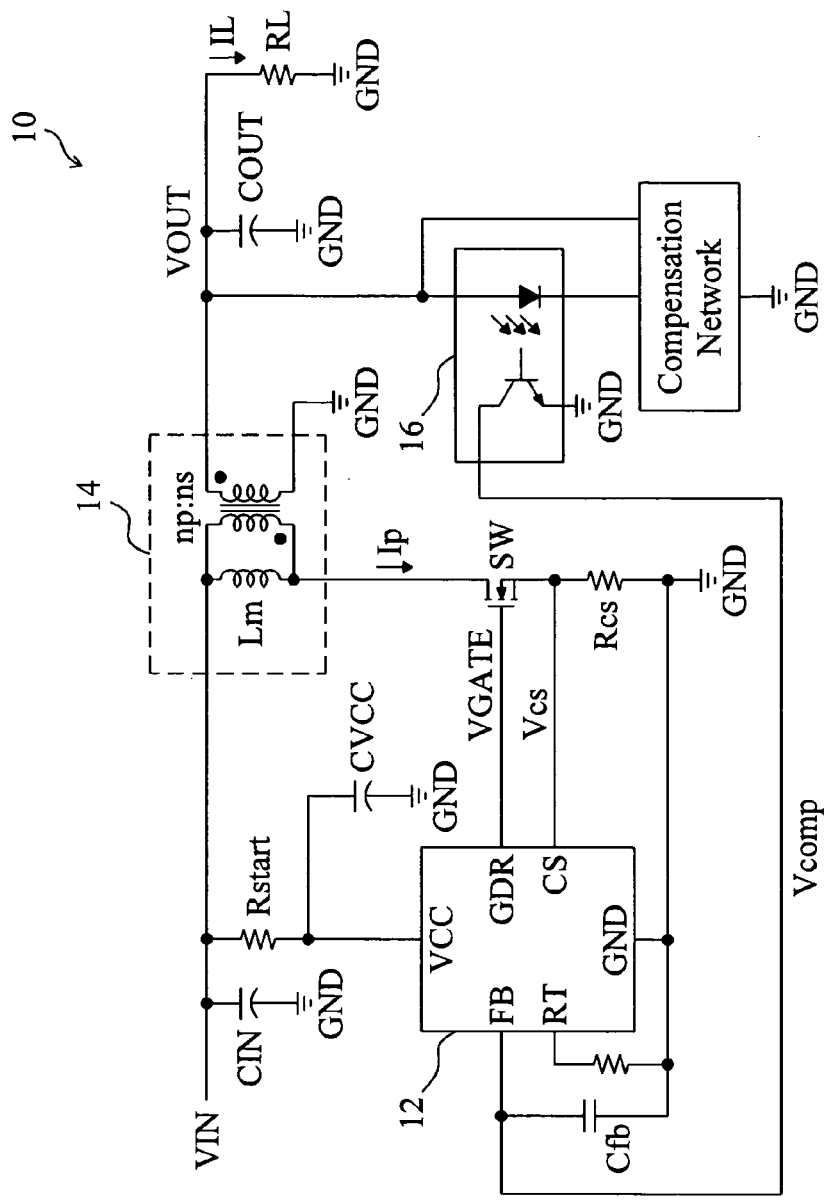
FIG. 1 is a circuit diagram of a conventional flyback converter.
Figure 2:
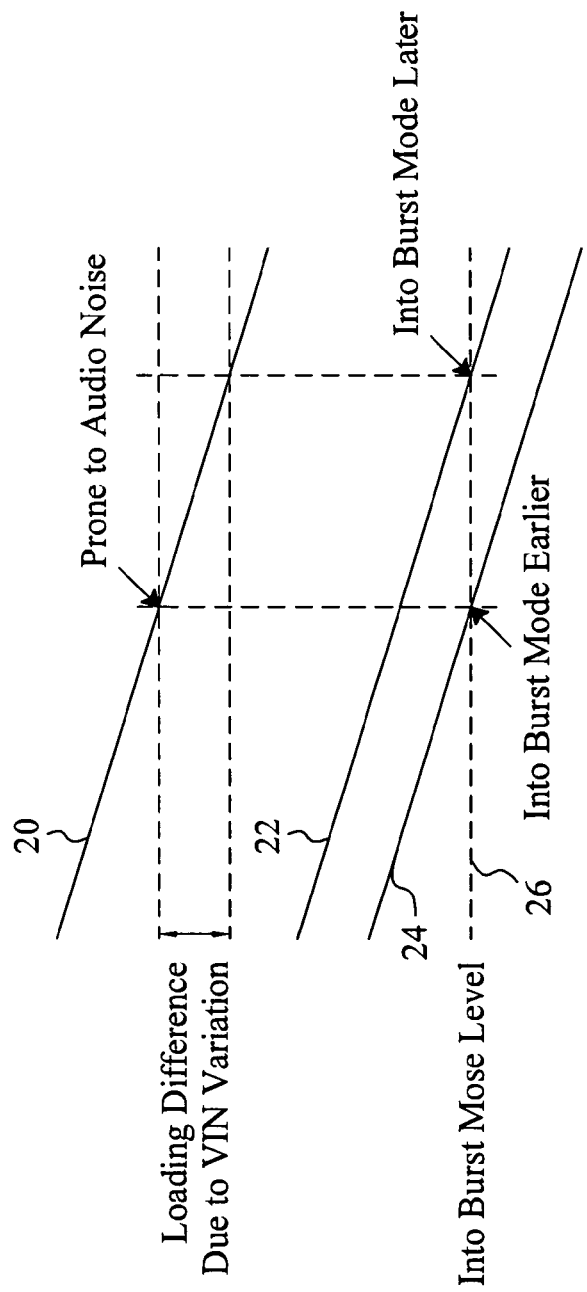
FIG. 2 is a diagram showing the burst mode entry points under different input voltages.
Figure 3:
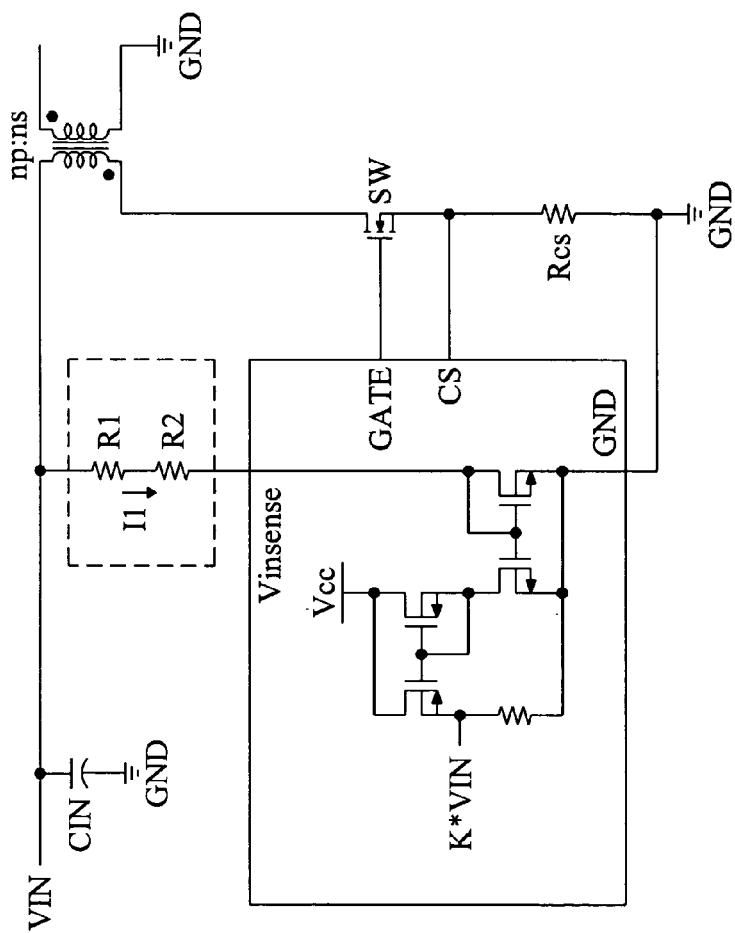
FIG. 3 is a diagram showing a conventional method to obtain the input voltage information in a flyback converter.
Figure 4:
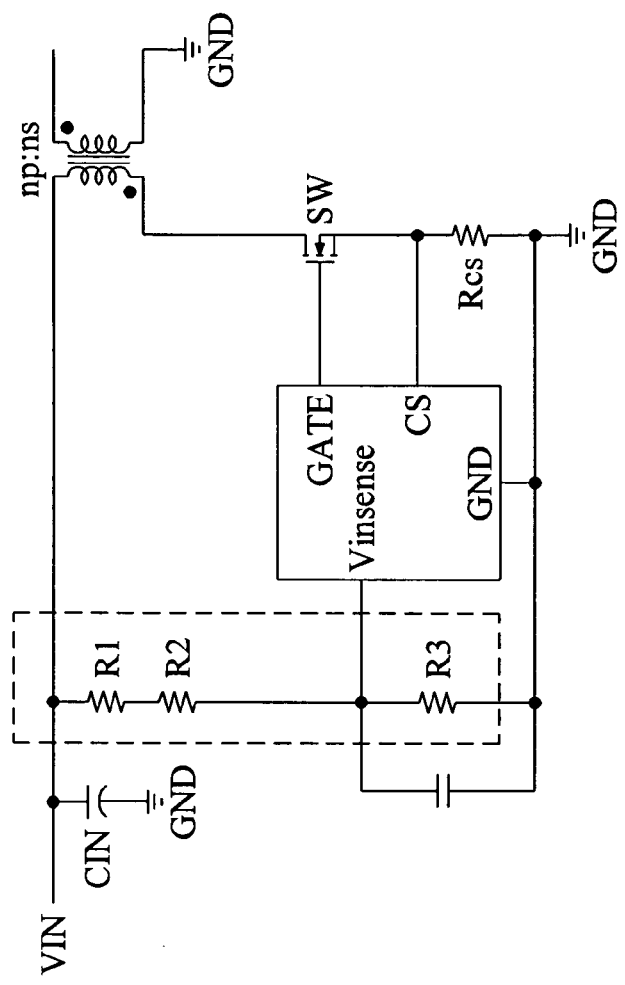
FIG. 4 is a diagram showing another conventional method to obtain the input voltage information in a flyback converter.
Figure 7:
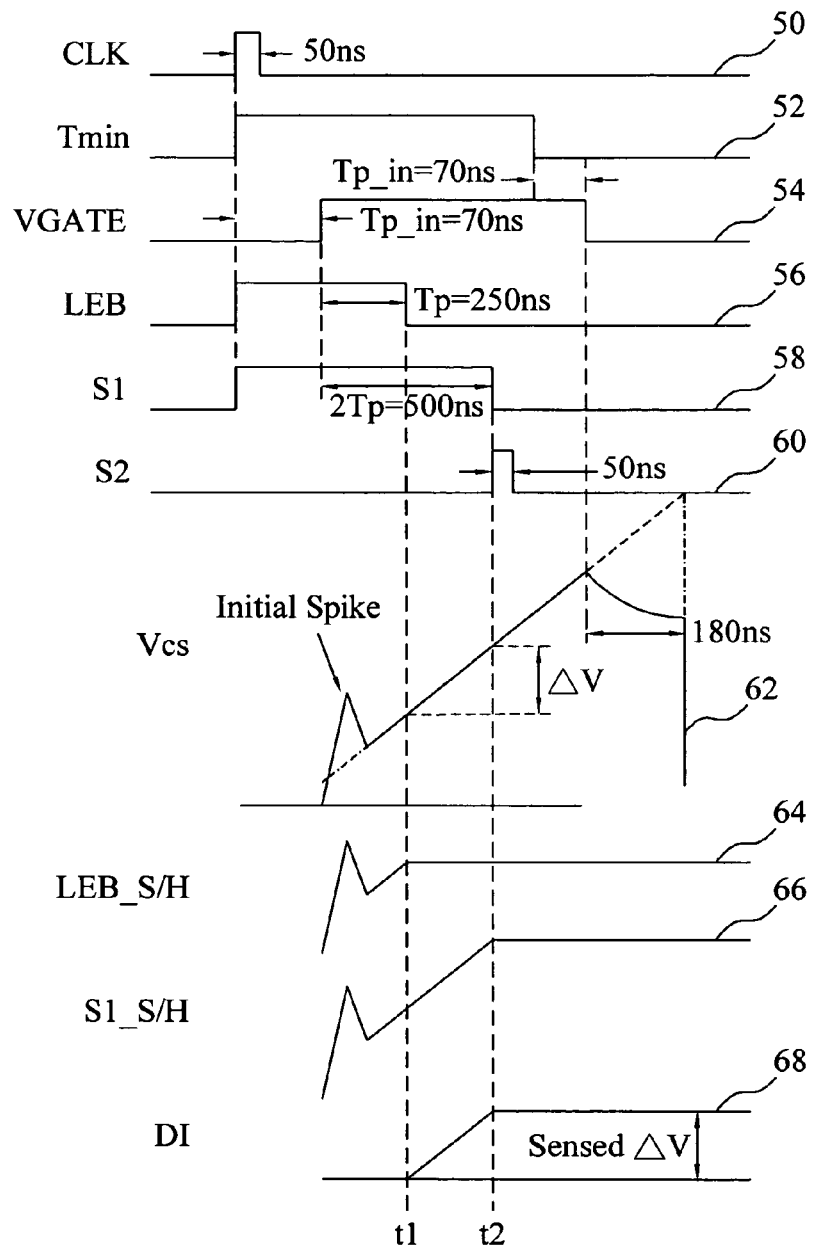
FIG. 7 is a timing diagram showing a sensing method according to the present invention.

FIG. 7 is a diagram showing a sensing method according to the present invention, in which waveform 50 represents a clock CLK, waveform 52 represents a minimum on-time Tmin, waveform 54 represents the control signal VGATE, waveform 56 represents the leading-edge blanking signal LEB, waveform 58 represents the signal S1, waveform 60 represents the signal S2, waveform 62 represents the current sense signal Vcs, waveform 64 represents the signal LEB_S/H, waveform 66 represents the signal S1_S/H, and waveform 68 represents the signal DI. Referring to FIGS. 1, 6 and 7, the minimum on-time Tmin is used to improve the light-load efficiency and ensure that there is enough time to finish the sensing of the variation of the current sense signal Vcs, and the clock CLK is used to turn on the power switch SW. Ideally, the control signal VGATE should transit to high to turn on the power switch SW immediately in response to the rising edge of the clock CLK. However, due to logic delay within the controller chip 12, there will be a logic delay time Tp_in from the rising edge of the clock CLK to the rising edge of the control signal VGATE, as shown by the waveform 54. Also, there is a drive delay time Td from the rising edge of the control signal VGATE to the time point that the power switch SW turns on. Hence, the turn-on of the power switch SW will be delayed by a propagation delay time Tp_in+Td after the rising edge of the clock CLK. When the power switch SW is turned on, the current sense signal Vcs begins to rise up, as shown by the waveform 62. On the other hand, the signals LEB and S1 are synchronous with the clock CLK. At the rising edge of the clock CLK, the signals LEB and S1 turn on switches 322 and 342, respectively. At time t1, the signal LEB transits to low and therefore turn off the switch 322, so that the signal LEB_S/H will be the value of the current sense signal Vcs sampled and held by the sampling and holding circuit 32 at that time point, as shown by the waveform 64. At time t2, the signal S1 transits to low and therefore turn off the switch 342, so that the signal S1_S/H will be the value of the current sense signal Vcs sampled and held by the sampling and holding circuit 34 at that time point, as shown by the waveform 66. The error amplifier 36 performs subtraction operation on the signals S1_S/H and LEB_S/H to generate the signal DI, as shown by the waveform 68. When the signal S1 transits to low, the one-shot circuit 38 is triggered concurrently to assert the signal S2, as shown by the waveform 60. Thus, the switch 402 is turned on to enable the sampling and holding of the signal DI, and in consequence the variation ΔV of the current sense signal Vcs from time t1 to time t2 is obtained. The variation ΔV of the current sense signal Vcs is sensed during each period of the clock CLK to ensure that the correct variation ΔV is obtained in CCM as well as in DCM.

Referring to FIG. 7, the difference between the time t1 and the time t2 is the time period Tp. Preferably, the time period Tp is set to be equal to the propagation delay time. If the time period Tp is the propagation delay time, the variation ΔV obtained can also be used to compensate for propagation delay at a frequency-reduction entry point or at a burst mode level.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A sensing circuit for a flyback converter including a transformer to convert an input voltage into an output voltage, the sensing circuit comprising:
   a first sampling and holding circuit sampling and holding a current sense signal at a first time point to generate a first signal, wherein the current sense signal is a function of a primary current the transformer;
   a second sampling and holding circuit sampling and holding the current sense signal at a second time point after the first time point to generate a second signal; and
   a subtraction circuit connected to the first and second sampling and holding circuits to subtract the first signal from the second signal to generate a third signal for determining a variation of the current sense signal from the first time point to the second time point;
   wherein the first and the second time points have a time difference therebetween, which is set according to propagation delay.

2. The sensing circuit of claim 1, wherein the subtraction circuit comprises an error amplifier having two inputs to receive the first signal and the second signal and an output to provide the third signal.

3. The sensing circuit of claim 1, further comprising a third sampling and holding circuit connected to the subtraction circuit to sample and hold the third signal to extract the variation of the current sense signal.

4. The sensing circuit of claim 3, further comprising a one-shot circuit connected to the third sampling and holding circuit to trigger the third sampling and holding circuit after the second time point to sample and hold the third signal.

5. A sensing method for a flyback converter including a transformer to convert an input voltage into an output voltage, the sensing method comprising:
   sampling and holding a current sense signal at a first time point and a second time point after the first time point to generate a first signal and a second signal, respectively, wherein the current sense signal is a function of a primary current of the transformer; and subtracting the first signal from the second signal to generate a third signal for determining a variation of the current sense signal from the first time point to the second time point;

wherein the first and the second time points have a time difference therebetween, which is set according to propagation delay.

6. The sensing method of claim 5, further comprising sampling and holding the third signal after the second time point to extract the variation of the current sense signal from the first time point to the second time point.

* * * * *